US008809838B2

(12) United States Patent
Jeong et al.

(10) Patent No.: US 8,809,838 B2
(45) Date of Patent: *Aug. 19, 2014

(54) ORGANIC LIGHT EMITTING DIODE DISPLAY

(75) Inventors: Hee-Seong Jeong, Yongin (KR); Hee-Chul Jeon, Yongin (KR); Woo-Suk Jung, Yongin (KR); Chul-Woo Jeong, Yongin (KR); Noh-Min Kwak, Yongin (KR); Eun-Ah Kim, Yongin (KR); Soon-Ryong Park, Yongin (KR); Joo-Hwa Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 410 days.

This patent is subject to a terminal disclaimer.

(21) Appl. No.: 12/702,185

(22) Filed: Feb. 8, 2010

(65) Prior Publication Data

US 2010/0200845 A1      Aug. 12, 2010

(30) Foreign Application Priority Data

Feb. 9, 2009   (KR) .................. 10-2009-0010261

(51) Int. Cl.
     *H01L 29/08*    (2006.01)
(52) U.S. Cl.
     USPC .......... 257/40; 257/E51.022; 257/57; 257/98; 257/59; 257/79
(58) Field of Classification Search
     USPC ............................................. 257/40
     See application file for complete search history.

(56) References Cited

U.S. PATENT DOCUMENTS

| 5,834,803 | A  | * | 11/1998 | Nashimoto | .......... | 257/295 |
| 7,633,223 | B2 | * | 12/2009 | Yamazaki  | .......... | 313/512 |
| 7,663,142 | B2 | * | 2/2010  | Murakami  | .......... | 257/59  |

(Continued)

FOREIGN PATENT DOCUMENTS

| CN | 101019250    | 8/2007 |
| EP | 2287939 A1   | 2/2011 |

(Continued)

OTHER PUBLICATIONS

Ye Lihua et al., The effect of scattering particles on the photoluminescence of organic dye films, 2008 $2^{nd}$ IEEE International Nanoelectronics Conference, pp. 630-632, Advanced Photonics Center, School of Electronic Science and Engineering, Southeast University, Nanjing, China.

(Continued)

*Primary Examiner* — Michael Jung
*Assistant Examiner* — Ankush Singal
(74) *Attorney, Agent, or Firm* — Knobbe Martens Olson & Bear LLP (57) ABSTRACT

Embodiments provide an organic light emitting diode display. The display includes a substrate, a pixel electrode formed on the substrate, and an organic emissive layer formed on the pixel electrode. A common electrode is formed on the organic emissive layer. In addition, a crystallized light scattering layer is formed on the common electrode. The crystallized light scattering layer may be a crystallized organic or crystallized inorganic layer having a rough surface in order to effectively scatter light and prevent phenomenon, such as Newton's Rings from occurring in the display.

11 Claims, 5 Drawing Sheets

(56) References Cited

U.S. PATENT DOCUMENTS

| | | | |
|---|---|---|---|
| 7,667,392 B2* | 2/2010 | Noh et al. | 313/506 |
| 8,384,107 B1* | 2/2013 | Shum | 257/98 |
| 8,466,459 B2* | 6/2013 | Chang | 257/40 |
| 2002/0056837 A1* | 5/2002 | Yamanaka et al. | 257/57 |
| 2002/0113926 A1* | 8/2002 | Hanazawa et al. | 349/113 |
| 2003/0189210 A1* | 10/2003 | Yamazaki et al. | 257/72 |
| 2004/0135501 A1* | 7/2004 | Nishikawa | 313/506 |
| 2005/0128403 A1* | 6/2005 | Liu | 349/141 |
| 2005/0133793 A1* | 6/2005 | Kim | 257/72 |
| 2005/0269949 A1* | 12/2005 | Nishikawa et al. | 313/506 |
| 2006/0006795 A1* | 1/2006 | Strip | 313/504 |
| 2006/0046096 A1* | 3/2006 | Nomura et al. | 428/690 |
| 2006/0255336 A1* | 11/2006 | Kim | 257/40 |
| 2006/0255719 A1* | 11/2006 | Oikawa et al. | 313/503 |
| 2007/0029548 A1* | 2/2007 | Yamazaki et al. | 257/40 |
| 2007/0092981 A1* | 4/2007 | Jung et al. | 438/30 |
| 2007/0114526 A1* | 5/2007 | Yokoyama et al. | 257/40 |
| 2007/0195576 A1* | 8/2007 | Imada et al. | 365/103 |
| 2007/0224412 A1* | 9/2007 | Hara et al. | 428/336 |
| 2007/0281372 A1* | 12/2007 | Takiguchi et al. | 438/3 |
| 2008/0048557 A1* | 2/2008 | Birnstock et al. | 313/504 |
| 2008/0061687 A1* | 3/2008 | Cok et al. | 313/506 |
| 2008/0084150 A1 | 4/2008 | Cok | |
| 2008/0142800 A1* | 6/2008 | Arai et al. | 257/59 |
| 2008/0248316 A1* | 10/2008 | Goto et al. | 428/426 |
| 2008/0297043 A1* | 12/2008 | Nishikawa et al. | 313/504 |
| 2009/0068453 A1* | 3/2009 | Chung | 428/337 |
| 2009/0116249 A1* | 5/2009 | Cho et al. | 362/351 |
| 2010/0044692 A1* | 2/2010 | Kim et al. | 257/40 |
| 2010/0052519 A1* | 3/2010 | Jeon et al. | 313/504 |
| 2010/0171107 A1* | 7/2010 | Jung et al. | 257/40 |
| 2010/0201261 A1* | 8/2010 | Kwack et al. | 313/504 |
| 2010/0224894 A1* | 9/2010 | Kim et al. | 257/98 |
| 2011/0309307 A1 | 12/2011 | Zeika et al. | |

FOREIGN PATENT DOCUMENTS

| | | |
|---|---|---|
| JP | 11-511895 A | 10/1999 |
| JP | 2007-265987 | 10/2007 |
| JP | 2008-507809 | 3/2008 |
| JP | 2008-108628 A | 5/2008 |
| JP | 2008-251217 | 10/2008 |
| JP | 2008-538155 | 10/2008 |
| JP | 2009-004274 | 1/2009 |
| JP | 2009-505331 | 2/2009 |
| JP | 2010-015862 | 1/2010 |
| JP | 2012-512140 A | 5/2012 |
| KR | 10-0438797 | 4/2003 |
| KR | 10-0611756 | 12/2005 |
| KR | 10-0623696 | 3/2006 |
| KR | 10-0721571 | 9/2006 |
| KR | 10-2006-0127257 | 12/2006 |
| WO | 97/47050 A1 | 12/1997 |
| WO | WO 2006-010355 | 2/2006 |
| WO | WO 2006/010355 | 2/2006 |
| WO | WO 2007/059223 | 5/2007 |

OTHER PUBLICATIONS

The Collins English Dictionary, Second Edition, 1986, p. 1422.

* cited by examiner

FIG. 5

ORGANIC LIGHT EMITTING DIODE DISPLAY

CROSS-REFERENCE TO RELATED APPLICATIONS

This application claims priority to and the benefit of Korean Patent Application No. 10-2009-0010261 filed in the Korean Intellectual Property Office on Feb. 9, 2009, the disclosure of which is incorporated herein by reference in its entirety.

BACKGROUND

1. Field

The present disclosure relates to an organic light emitting diode display, and more particularly, to an organic light emitting diode display with enhanced visibility and image quality.

2. Description of the Related Technology

An organic light emitting diode (OLED) display typically has a plurality of organic light emitting diodes, each with a hole injection electrode, an organic emissive layer, and an electron injection electrode. In an organic light emitting diode display, electrons and holes are typically combined with each other in the organic emissive layer to thereby generate excitons. When the excitons shift from the excited state to the ground state, energy is generated so as to emit light, and images can be displayed on the basis of the emitted light.

Accordingly, the organic light emitting diode display typically involves an emissive characteristic, and differs from a liquid crystal display (LCD) in that it does not require a separate light source and can thus have reduced thickness and weight. Furthermore, as the organic light emitting diode display involves certain desirable characteristics such as lower power consumption, high luminance, and short response time, it has been spotlighted as a next generation display device for portable electronic appliances.

The hole injection electrodes or the electron injection electrodes of the organic light emitting diode display, and other various metal wires thereof, typically reflect light that is incident thereupon from the outside. When the organic light emitting diode display is used in a bright location, the black color expression and the contrast thereof can be poor due to the reflection of external light such that the visibility is deteriorated.

Furthermore, as the organic light emitting diode display typically has a plurality of thin films and substrates, concentric circle-shaped patterns like Newton's rings may occur due to optical interference induced by differences in refractive index of the plurality of thin films and substrates. Such Newton's rings can deteriorate the quality of images displayed by the organic light emitting diode display.

The above disclosure is provided only to enhance understanding of the background of embodiments of the invention and does not necessarily reflect the prior art that was known to a person of ordinary skill in the art.

SUMMARY

Embodiments of the invention provide an organic light emitting diode (OLED) display having advantages of improving visibility and image quality. With the organic light emitting diode display, the organic emissive layer may emit light in a direction of the common electrode to display images.

For organic light emitting diode displays according to embodiments of the invention, the reflection of external light and the occurrence of Newton's rings are prevented so that the visibility and image quality can be improved. Furthermore, the overall thickness of the organic light emitting diode display can be reduced.

An exemplary embodiment of the present invention provides an organic light emitting diode display including a substrate, a pixel electrode formed on the substrate, and an organic emissive layer formed on the pixel electrode. A common electrode is also formed on the organic emissive layer.

In an embodiment, a crystallized light scattering layer is formed on the common electrode. The light scattering layer may be formed from a crystallized organic layer or a crystallized inorganic layer. For example, the light scattering layer may be formed with an organic layer containing one or more materials selected from a-NPD, NPB, TPD, m-MTDATA, Alq3, LiF, PBD, TLTA, and CuPc. As another example, the light scattering layer may be formed with a silicon (Si)-containing inorganic layer.

The light scattering layer may be crystallized through heat treatment. The light scattering layer may have a relatively high surface roughness when compared with non-crystallized organic and inorganic layers.

DETAILED DESCRIPTION OF SOME EMBODIMENTS

Embodiments of the invention will now be described more fully hereinafter with reference to the accompanying drawings. As those skilled in the art will realize, the described embodiments may be modified in various different ways, all without departing from the spirit or scope of the invention.

Structural parts that are irrelevant to the description may be omitted in order to clearly describe embodiments of the invention, and like reference numerals designate like elements throughout the specification. Furthermore, as the size and thickness of the respective structural components shown in the drawings are arbitrarily illustrated for explanatory convenience, embodiments of the invention are not necessarily limited as illustrated.

In the drawings, the thickness of layers, films, panels, regions, etc., are exaggerated for clarity, better understanding, and convenience of description. It will be understood that when an element such as a layer, film, region, or panel is referred to as being "on" another element, it can be directly on the other element or intervening elements may also be present.

Furthermore, even though an active matrix (AM) organic light emitting diode (OLED) display having a 2Tr-1Cap structure with two thin film transistors (TFT) and one capacitor at each pixel is illustrated in the appended drawings, embodiments of the invention are not limited thereto. The organic light emitting diode display may have three or more thin film transistors and two or more capacitors at each pixel, and may have various structures with separate wires. A pixel is a minimal image display unit, and the organic light emitting diode display displays images by way of a plurality of pixels.

Figure 1:
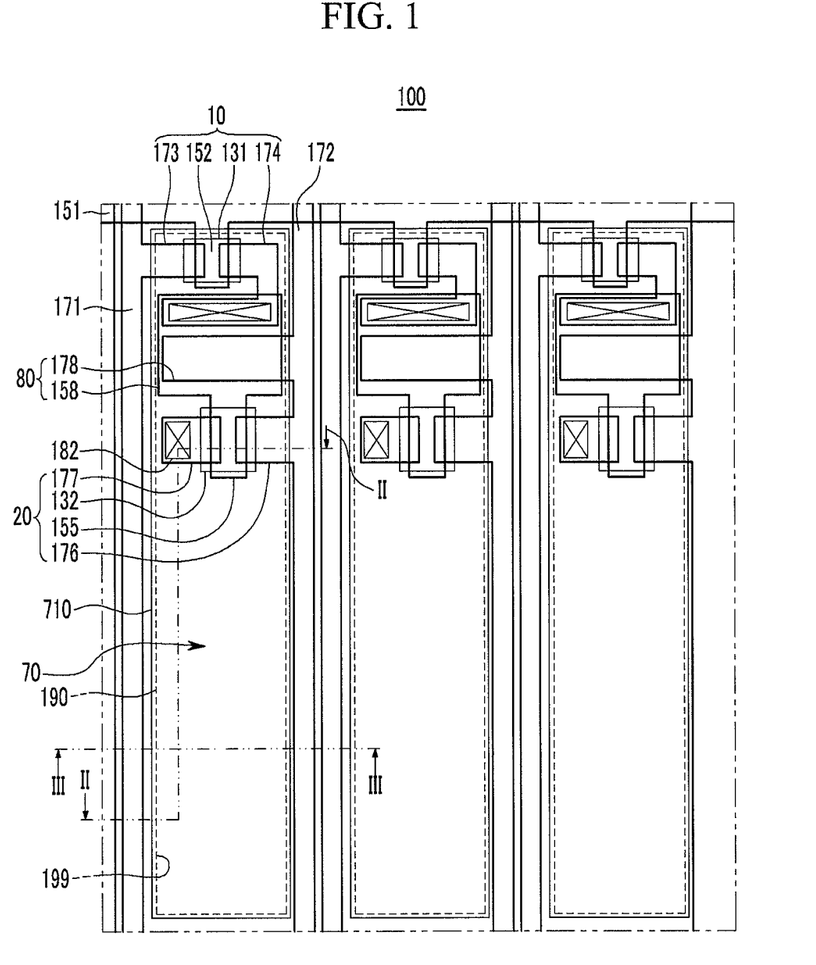
FIG. 1 is a layout view of an organic light emitting diode (OLED) display according to an embodiment of the invention.
Figure 2:
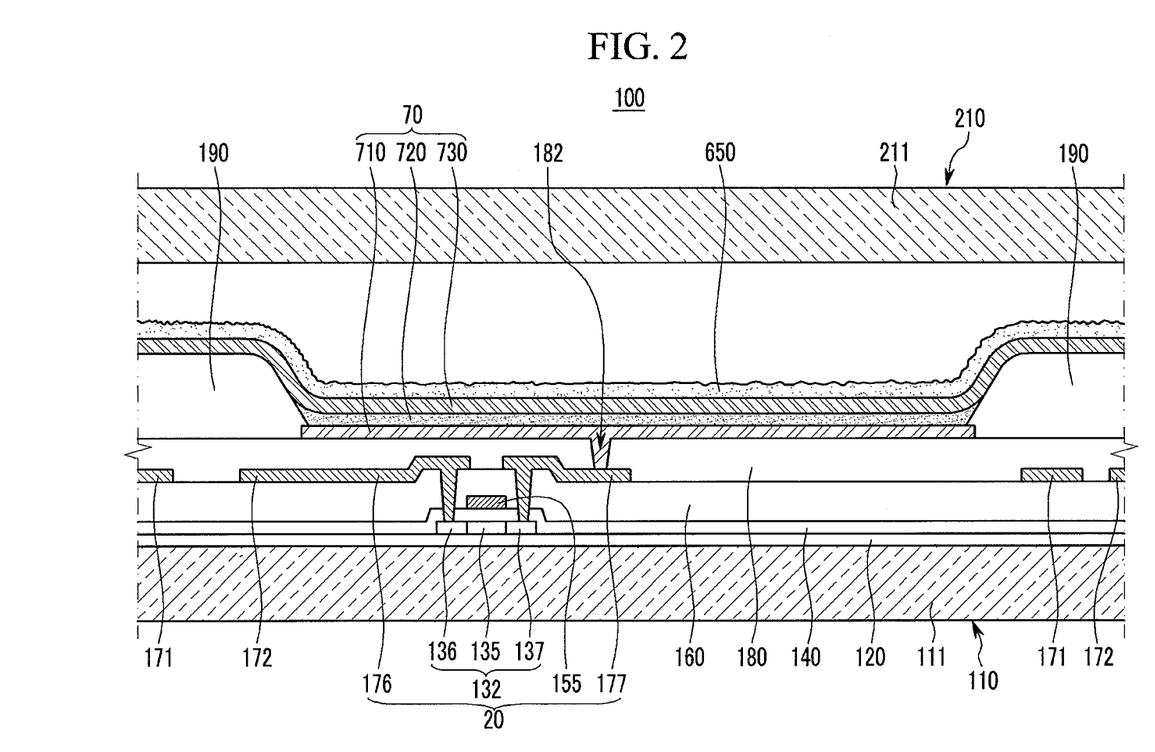
FIG. 2 is a cross-sectional view of the organic light emitting diode display taken along the II-II line of FIG. 1.
Figure 3:
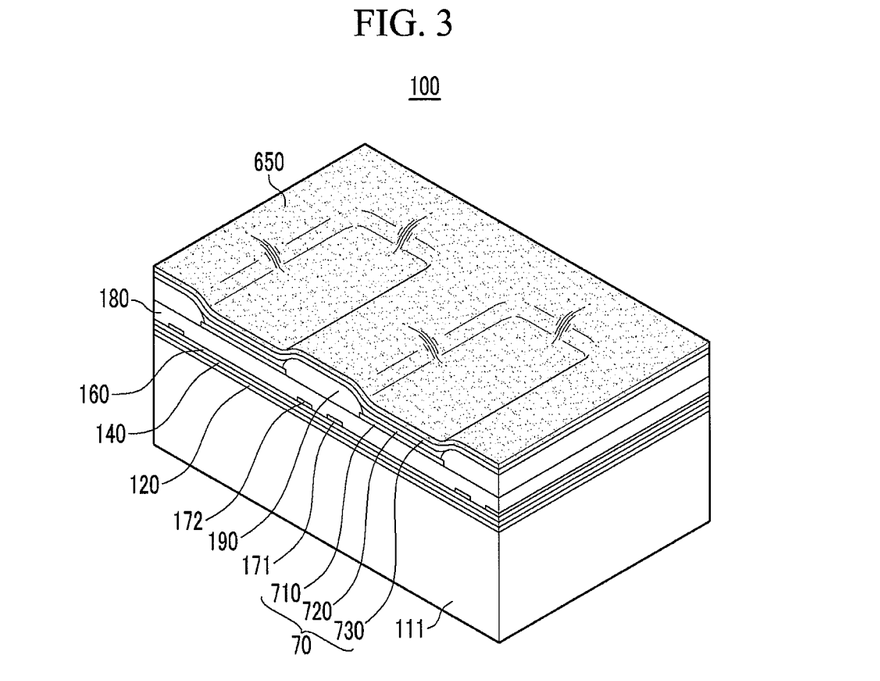
FIG. 3 is a partial perspective view of the organic light emitting diode display taken along the III-III line of FIG. 1.

An embodiment of the invention will now be described with reference to FIGS. 1-3. FIG. 1 is a layout view illustrating an exemplary pixel structure provided on a display substrate 110. FIG. 2 is a cross-sectional view of the display substrate 110 and a sealing member 210 taken along the II-II line of FIG. 1. FIG. 3 is a partial perspective view of the display substrate 110 taken along the III-III line of FIG. 1.

As shown in FIG. 1 and FIG. 2, an organic light emitting diode display 100 can include a display substrate 110 and a sealing member 210. The display substrate 110 can include a switching thin film transistor 10, a driving thin film transistor 20, a capacitor 80, and an organic light emitting diode (OLED) 70, which may be formed on a first substrate 111 at each pixel. The display substrate 110 can further include gate lines 151 arranged in a direction, data lines 171 crossing the gate lines 151 in an insulated manner, and common power lines 172. Here, a pixel can be defined by taking a gate line 151, a data line 171, and a common power line 172 as a boundary, but is not limited thereto.

The switching thin film transistor 10 can include a switching semiconductor layer 131, a switching gate electrode 152, a switching source electrode 173, and a switching drain electrode 174. The driving thin film transistor 20 can include a driving semiconductor layer 132, a driving gate electrode 155, a driving source electrode 176, and a driving drain electrode 177.

The switching thin film transistor 10 can be used as a switch for selecting pixels to emit light. The switching gate electrode 152 can be connected to the gate line 151. The switching source electrode 173 can be connected to the data line 171. The switching drain electrode 174 can be spaced apart from the switching source electrode 173 by a distance and can be connected to the first capacitor electrode plate 158.

The driving thin film transistor 20 may apply a driving voltage to the pixel electrode 710 to excite the organic emissive layer 720 of the organic light emitting diode 70 in the selected pixel. The driving gate electrode 155 can be connected to the first capacitor electrode plate 158. The driving source electrode 176 and the second capacitor electrode plate 178 can each be connected to the common power line 172. The driving drain electrode 177 can be connected to the pixel electrode 710 of the organic light emitting diode 70 through a contact hole 182.

For the above structure, the switching thin film transistor 10 can be driven by the gate voltage applied to the gate line 151, and can transmit the data voltage applied to the data line 171 to the driving thin film transistor 20. A voltage with a value corresponding to a difference between the common voltage applied to the driving thin film transistor 20 from the common power line 172 and the data voltage transmitted from the switching thin film transistor 10 can be stored at the capacitor 80, and a current corresponding to the voltage stored at the capacitor 80 can flow to the organic light emitting diode 70 through the driving thin film transistor 20 to thereby excite the organic light emitting diode 70.

The organic light emitting diode 70 can include a pixel electrode 710, an organic emissive layer 720 formed on the pixel electrode 710, and a common electrode 730 formed on the organic emissive layer 720. The pixel electrode 710 can be a positive (+) electrode or anode being the hole injection electrode, and the common electrode 730 can be a negative (−) electrode or cathode being the electron injection electrode. However, embodiments of the invention are not necessarily limited thereto, and depending upon the driving method of the organic light emitting diode display 100, the pixel electrode 710 may be a cathode while the common electrode 730 is an anode. Holes and electrons can be injected from the pixel and the common electrodes 710 and 730 into the organic emissive layer 720. When excitons, or the combinations of the injected holes and electrons, shift from an excited state to the ground state, the emission of light occurs.

Furthermore, for an organic light emitting diode display according to an embodiment of the invention, the organic light emitting diode 70 can emit light from the organic emissive layer 720 in the direction opposite to the pixel electrode 710, that is, in the direction of the common electrode 730, to thereby display images. In this way, the organic light emitting diode display 100 may be a front emission type device.

The capacitor 80 can have first and second capacitor electrode plates 158 and 178, and an interlayer insulating layer 160 interposed between the two capacitor electrode plates 158 and 178. The interlayer insulating layer 160 typically functions as a dielectric. The capacitance may be determined depending upon the electric charges charged at the capacitor 80, and the voltages applied to the two capacitor electrode plates 158 and 178.

The display substrate 110 can further include a pixel definition layer 190 and a light scattering layer 650. The pixel definition layer 190 can have openings 199, each exposing the pixel electrode 710, in order to define emissive and non-emissive regions of the organic light emitting diode 70. That is, the pixel electrode 710 and the opening 199 of the pixel definition layer 190 can be formed at each pixel. The pixel electrode 710, the organic emissive layer 720, and the common electrode 730 can be sequentially deposited within the opening 199 of the pixel definition layer 190 such that the organic emissive layer 720 emits light. Accordingly, the area of the pixel definition layer 190 can be substantially a non-emissive region, and the area of the opening 199 of the pixel definition layer 190 can be substantially an emissive region.

The light scattering layer 650 can be formed on the common electrode 730 to scatter the light incident upon the organic light emitting diode 70 from the outside. The light scattering layer 650 can also scatter the light flowing in from the outside and reflected against several conductive wires, such as the common and pixel electrodes 730 and 710 of the organic light emitting diode 70, the gate lines 151, the data lines 171, and the common power lines 172.

The light scattering layer 650 can be formed with either one of a crystallized organic layer and a crystallized inorganic layer. Specifically, the light scattering layer 650 can be formed by crystallizing an organic layer including one or more of a-NPD, NPB, TPD, m-MTDATA, $Alq_3$, LiF, PBD, TLTA, and CuPc, or by crystallizing an inorganic layer including silicon (Si), such as silicon nitride (SiNx), silicon oxide (SiOx), and silicon oxynitride (SiOxNy). The light scattering layer 650 can be crystallized through heat treatment.

The light scattering layer 650 can be a crystallized organic or a crystallized inorganic layer that exhibits a relatively high surface roughness compared with a non-crystallized organic or inorganic layer. Accordingly, due to this surface roughness, the crystallized light scattering layer 650 can scatter the light in an effective manner.

Since the light scattering layer 650 functions to scatter the light, it can prevent the reflection of external light so that the visibility of the organic light emitting diode display 100 can be improved. Furthermore, the light scattering layer 650 can also serve to effectively emit the light generated by the organic light emitting diode 70. In particular, when the light scattering layer 650 is formed with an organic material similar to that for the organic emissive layer 720, it can serve to emit the light from the organic emissive layer 720 more effectively. The light scattering layer 650 scatters the light so as to prevent the reflection of external light, and simultaneously can prevent Newton's rings from occurring in the organic light emitting diode display 100 in an effective manner.

Newton's rings may occur among several layers of the organic light emitting diode display 100. For example, the Newton's rings may occur between the display substrate 110 and the sealing member 210 spaced apart from each other by a distance, which will be described later. When light passes layers that have different refractive indexes and thicknesses from each other, optical interference may occur due to the phase difference thereof, and thus, Newton's rings may occur. The degree of occurrence of Newton's rings can be influenced by the refractive index, thickness, and phase difference of the layers, and the intensity of the light. The distance between the layers should be properly controlled in order to prevent the occurrence of Newton's rings. That is, the distance between the display substrate 110 and the sealing member 210 should be large enough to prevent the Newton's rings from occurring therebetween.

However, the light scattering layer 650 scatters the light so as to prevent or minimize the occurrence of Newton's rings. That is, the light scattering layer 650 can serve as an anti-Newton's-ring film. Accordingly, the distance between the display substrate 110 and the sealing member 210 can be minimized. Furthermore, the overall thickness of the organic light emitting diode display 100 can be reduced.

The sealing member 210 faces the display substrate 110 such that it seals the thin film transistors 10 and 20, the capacitors 80, and the organic light emitting diodes 70 from the outside. The sealing member 210 includes a second substrate 211. Although not shown in the drawings, a sealant may be disposed along the edges of the display substrate 110 and the sealing member 210 so as to seal them in a vacuum-tight manner, and spacers may be interposed between the display substrate 110 and the sealing member 210 so as to space them at a constant predetermined distance apart from each other.

The above structure of the organic light emitting diode display 100 can effectively prevent deterioration of visibility due to the reflection of external light. Loss of light generated from the organic light emitting diode 70 can thus be minimized and more light is emitted to the outside.

Furthermore, with the presence of the light scattering layer 650, the organic light emitting diode display 100 may include a polarizing member that is commonly used to prevent the reflection of external light. Therefore, the organic light emitting diode display 100 can be improved in emissive efficiency, which is relatively low with the usage of a polarizing member. That is, the luminance and life span of the organic light emitting diode display 100 can be improved.

Furthermore, with the organic light emitting diode display 100, the occurrence of Newton's rings can be prevented. When the occurrence of Newton's rings is prevented, the distance between the display substrate 110 and the sealing member 210 is minimized so that the overall thickness of the organic light emitting diode display 100 can be reduced.

A structure of an organic light emitting diode display 100 according to an embodiment of the invention will now be specifically described depending upon the sequence of deposition. Furthermore, the structure of a thin film transistor will be described based on the driving thin film transistor 20. The switching thin film transistor 10 will be simply described with respect to differences thereof from the driving thin film transistor 20.

The display substrate 110 will be described in detail first. As shown in FIG. 2, the first substrate 111 may be formed with an insulating material such as glass, quartz, ceramic, and plastic. However, embodiments of the invention are not limited thereto. The first substrate 111 may be formed with a metallic material such as stainless steel.

A buffer layer 120 may be formed on the first substrate 111. The buffer layer 120 can help prevent the intrusion of impure elements and flattening the surface thereof, and may be formed with a material that is appropriate to the role thereof. For example, the buffer layer 120 may be formed with at least one material selected from silicon nitride (SiNx), silicon oxide (SiOx), and silicon oxynitride (SiOxNy). However, the buffer layer 120 is not necessarily required, and hence may be omitted depending upon the kind of the first substrate 111, and the processing conditions.

A driving semiconductor layer 132 may be formed on the buffer layer 120. The driving semiconductor layer 132 may be formed of polycrystalline silicon. The driving semiconductor layer 132 can have a channel region 135 that is not doped with any impurities, and p+ doped source and drain regions 136 and 137 can be formed on both sides of the channel region 135. The dopant ion material may be a P type impurity such as boron (B), and may be formed primarily with $B_2H_6$. The impurity may be differentiated depending upon the kinds of the thin film transistors.

According to an embodiment, a thin film transistor with a PMOS structure using a P-type impurity may be used as the driving thin film transistor 20, but the driving thin film transistor 20 is not limited thereto. A thin film transistor with an NMOS structure or a CMOS structure may alternatively be used as the driving thin film transistor 20.

Furthermore, although the thin film transistor 20 shown in FIG. 2 is described as a polycrystalline thin film transistor containing polycrystalline silicon, the switching thin film transistor 10 (not shown in FIG. 2) may be either a polycrystalline thin film transistor or an amorphous thin film transistor containing amorphous silicon.

A gate insulating layer 140 can be formed on the driving semiconductor layer 132 with silicon nitride (SiNx) or silicon oxide (SiOx). A gate wire including gate electrodes 155 can be formed on the gate insulating layer 140. The gate wire can further include gate lines 151, first capacitor electrode plates 158, and other wiring lines. The driving gate electrode 155 can be overlapped with at least a part of the driving semiconductor layer 132, and particularly with the channel region 135 thereof.

An interlayer insulating layer 160 can be formed on the gate insulating layer 140 such that it covers the driving gate electrodes 155. The gate insulating layer 140 and the interlayer insulating layer 160 can commonly have through-holes exposing the source and drain regions 136 and 137 of the driving semiconductor layer 132. The interlayer insulating layer 160 and the gate insulating layer 140 can be formed with silicon nitride (SiNx) or silicon oxide (SiOx).

A data wire including driving source and drain electrodes 176 and 177 can be formed on the interlayer insulating layer 160. The data wire typically includes data lines 171, common power lines 172, second capacitor electrode plates 178, and other wiring lines. The driving source and drain electrodes 176 and 177 can be connected to the source and drain regions 136 and 137 of the driving semiconductor layer 132 via the through-holes formed at the interlayer insulating layer 160 and the gate insulating layer 140, respectively.

In this way, the driving thin film transistor 20 can be formed with the driving semiconductor layer 132, the driving gate electrode 155, and the driving source and drain electrodes 176 and 177. The structure of the driving thin film transistor 20 is not limited to the above, but may be altered in various manners with a structure available to those skilled in the art.

A planarization layer 180 can be formed on the interlayer insulating layer 160 such that it covers the data wires 172, 176, 177, and 178. The planarization layer 180 may remove a stepped difference and flatten the surface in order to heighten the luminous efficiency of an organic light emitting diode 70 to be formed thereon. Furthermore, the planarization layer 180 may have a contact hole 182 partially exposing the drain electrode 177.

The planarization layer 180 may be formed of at least one material selected from acrylic resin, epoxy resin, phenolic resin, polyamide resin, polyimide resin, unsaturated polyester resin, polyphenylene ether resin, polyphenylene sulfide resin, and benzocyclobutene (BCB).

Furthermore, embodiments of the invention are not limited to the above-described structure. For example, either one of the planarization layer 180 and the interlayer insulating layer 160 may be excluded from the above-described structure.

A pixel electrode 710 of the organic light emitting diode 70 may be formed on the planarization layer 180. That is, the organic light emitting diode display 100 can have a plurality of pixel electrodes 710 disposed at a plurality of pixels, respectively. The plurality of pixel electrodes 710 may be spaced apart from each other by a distance. The pixel electrode 710 may be connected to the drain electrode 177 through the contact hole 182 of the planarization layer 180.

A pixel definition layer 190 having a plurality of openings each exposing a pixel electrode 710 may be formed on the planarization layer 180. That is, the openings 199 of the pixel definition layer 190 can be formed at the respective pixels one by one. The pixel electrode 710 can be disposed corresponding to the opening 199 of the pixel definition layer 190. However, the pixel electrode 710 may not necessarily be disposed only at the opening 199 of the pixel definition layer 190, but may be disposed under the pixel definition layer 190 such that it is partially overlapped with the pixel definition layer 190. The area of the pixel definition layer 190 may be substantially a non-emissive region, and the area of the opening 199 of the pixel definition layer 190 substantially an emissive region.

The pixel definition layer 190 may be formed of a resin such as polyacrylate resin and polyimide resin, or a silica-based inorganic material. The pixel definition layer 190 may be formed through a photolithography process or a photo-etching process.

An organic emissive layer 720 may be formed on the pixel electrode 710, and a common electrode 730 may be formed on the organic emissive layer 720. In this way, the organic light emitting diode 70 can be formed with the pixel electrode 710, the organic emissive layer 720, and the common electrode 730. The organic emissive layer 720 may be disposed between the pixel and common electrodes 710 and 730 within the opening 199 of the pixel definition layer 190 close thereto so as to emit light. The common electrode 730 may be formed on the organic emissive layer 720 and the pixel definition layer 190.

The organic emissive layer 720 may be formed with a low molecular organic material or a high molecular organic material. The organic emissive layer 720 may have a multi-layered structure with some or all of an emission layer, a hole injection layer (HIL), a hole transport layer (HTL), an electron transport layer (ETL), and an electron injection layer (EIL). If the organic emissive layer 720 is formed with all of the layers, the hole injection layer (HIL) can be disposed on the pixel electrode 710 being the anode, and sequentially overlaid with the hole transport layer (HTL), the emission layer, the electron transport layer (ETL), and the electron injection layer (EIL).

Furthermore, as shown in FIG. 2, the organic emissive layer 720 may be disposed within the opening 199 of the pixel definition layer 190, but embodiments of the invention are not limited thereto. The organic emissive layer 720 may be formed either on the pixel electrode 710 within the opening 199 of the pixel definition layer 190, or between the pixel definition layer 190 and the common electrode 730. Specifically, the hole injection layer (HIL), the hole transport layer (HTL), the electron transport layer (ETL), and the electron injection layer (EIL) belonging to the organic emissive layer 720 in addition to the emission layer may be formed on the pixel definition layer 190 as well as on the pixel electrode 710, as with the common electrode 730, using an open mask. That is, one or more layer components of the organic emissive layer 720 may be interposed between the pixel definition layer 190 and the common electrode 730.

The pixel and the common electrodes 710 and 730 may be formed of a transparent conductive material, or a semi-transparent or reflective conductive material, respectively. The organic light emitting diode display 100 may be a front emission type, a rear emission type, or a double-sided emission type device, depending upon the kinds of materials for forming the pixel and common electrodes 710 and 730.

An organic light emitting diode display 100 according to an embodiment of the invention can be formed as a front emission type device. That is, the organic light emitting diode 70 can emit light in the direction of the sealing member 210 via the light scattering layer 650 to thereby display images.

The transparent conductive material may be formed of indium tin oxide (ITO), indium zinc oxide (IZO), zinc oxide (ZnO), or indium oxide ($In_2O_3$). The reflective material and the semi-transparent material may be selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

As shown in FIG. 3, a light scattering layer 650 may be formed on the common electrode 730. The light scattering layer 650 may be formed by crystallizing an organic layer including one or more of a-NPD, NPB, TPD, m-MTDATA, $Alq_3$, LiF, PBD, TLTA, and CuPc, or by crystallizing a silicon (Si)-containing inorganic layer such as silicon nitride (SiNx), silicon oxide (SiOx), and silicon oxynitride (SiOxNy). The organic layer including one or more of a-NPD, NPB, TPD, m-MTDATA, $Alq_3$, LiF, PBD, TLTA, and CuPc may be used as a material for forming the emission layer, the hole injection layer (HIL), the hole transport layer (HTL), the electron transport layer (ETL), and the electron injection layer (EIL) of the organic emissive layer 720. Furthermore, the silicon (Si)-contained inorganic layer may also be used as a material for forming the semiconductor layer 132.

The light scattering layer 650 based on the crystallized organic or inorganic layer can provide higher surface roughness than the surface roughness of the non-crystallized organic or inorganic layer. Accordingly, the light scattering layer 650 can scatter light in an effective manner.

The light scattering layer 650 typically scatters the light flowing in from the outside and reflected against the pixel electrode 710, the common electrode 730, and other conductive layers. That is, the light scattering layer 650 can prevent the reflection of external light so that the organic light emitting diode display 100 is improved in visibility. Furthermore, when the light scattering layer 650 is formed with an organic material similar to that of the organic emissive layer 720, the light scattering layer 650 can serve to emit light from the organic emissive layer 720 more effectively.

The light scattering layer 650 can scatter the light to thereby prevent the reflection of external light, and simultaneously prevent the Newton's rings from occurring in the organic light emitting diode display 100.

Referring to FIG. 2 again, the sealing member 210 is shown to face the light scattering layer 650 from the top. The second substrate 211 of the sealing member 210 can be formed of a transparent material, such as glass and plastic.

Although not shown in the drawings, a sealant may be disposed along the edges of the display substrate 110 and the sealing member 210 to seal them in a vacuum-tight manner, and spacers may be interposed between the display substrate 110 and the sealing member 210 to constantly space them from each other by a predetermined distance.

Embodiments of the organic light emitting diode display 100 as described above can provide improved visibility. Furthermore, loss of light from the organic light emitting diode 70 can be minimized, and emitted to the outside.

The organic light emitting diode display 100 can further avoid the occurrence of Newton's rings. The distance between the display substrate 110 and the sealing member 210 can be minimized so that the overall thickness of the organic light emitting diode display 100 can be reduced.

Examples and comparative examples will now be described with reference to FIG. 4 and FIG. 5. The structure according to examples of embodiments of the invention had a crystallized light scattering layer 650, whereas the structure according to the comparative examples had a non-crystallized organic layer disposed on the same plane as the light scattering layer 650.

Figure 4:
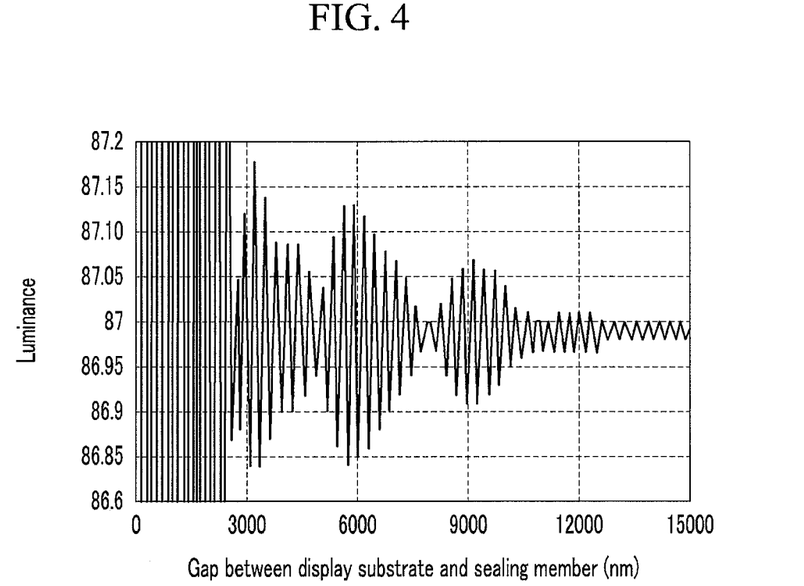
FIG. 4 and FIG. 5 are graphs illustrating experimental results according to examples and comparative examples.

FIG. 4 is a graph illustrating the variation in luminance as a function of the distance between the display substrate 110 and the sealing member 210 with the structure according to the comparative examples. As shown in FIG. 4, it can be observed from the structure according to the comparative examples that the distance between the display substrate 110 and the sealing member 210 should be set at about 12,000 nm or more in order to prevent the occurrence of Newton's rings.

Figure 5:
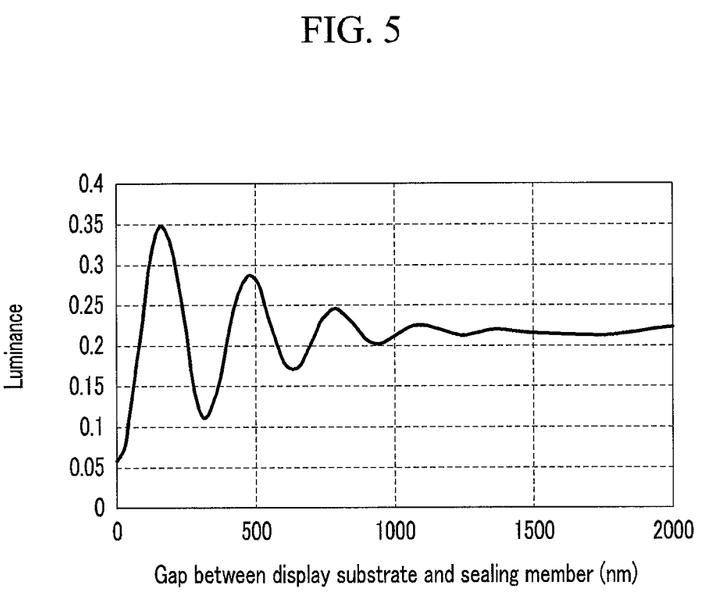

FIG. 5 is a graph illustrating the variation of luminance as a function of the distance between the display substrate 110 and the sealing member 210 with the structure according to examples of embodiments of the invention. As shown in FIG. 5, it can be observed from the structure according to the examples that the distance between the display substrate 110 and the sealing member 210 should be set at about 1000 nm or more in order to prevent the occurrence of Newton's rings.

It can be known from the experimental results of the examples and the comparative examples that an organic light emitting diode display 100 with a light scattering layer 650 according to embodiments of the invention effectively prevents the occurrence of Newton's rings, and minimizes the distance between the display substrate 110 and the sealing member 210. Accordingly, the overall thickness of the organic light emitting diode display 100 can be reduced.

While the invention has been described in connection with certain embodiments, it is to be understood that the invention is not limited to the disclosed embodiments, but is intended to cover various modifications and equivalent arrangements included within the spirit and scope of the appended claims.

What is claimed is:

1. An organic light emitting diode display comprising:
   a substrate;
   a pixel electrode formed over the substrate;
   an organic emissive layer formed over the pixel electrode;
   a common electrode formed over the organic emissive layer; and
   a light scattering layer formed over the common electrode, the light scattering layer comprising a crystallized top surface which has a roughness value greater than that of a non-crystallized surface of the same material,
   wherein the material of the light scattering layer is the same as a material for the organic emissive layer.

2. The organic light emitting diode display of claim 1, wherein the light scattering layer comprises a crystallized organic layer.

3. The organic light emitting diode display of claim 1, wherein the organic emissive layer emits light in a direction of the common electrode to display images.

4. The organic light emitting diode display of claim 1, wherein the crystallized top surface is roughened by crystallization of the material.

5. The organic light emitting diode display of claim 2, wherein the light scattering layer comprises an organic layer including one or more materials selected from the group comprising a-NPD, NPB, TPD, m-MTDATA, $Alq_3$, LiF, PBD, TLTA, and CuPc.

6. The organic light emitting diode display of claim 2, wherein the light scattering layer is crystallized through heat treatment.

7. An organic light emitting diode display comprising:
   a substrate;
   an organic emissive layer formed over the substrate;
   a light scattering layer formed over the organic emissive layer, the light scattering layer comprises a crystallized top surface which has a roughness value greater than that of the non-crystallized surface of the same material,
   wherein the material of the light scattering layer is the same as a material for the organic emissive layer.

8. The organic light emitting diode of claim 7, wherein the scattering layer comprises an organic material.

9. The organic light emitting diode of claim 7, wherein the scattering layer comprises a crystallized organic material.

10. The organic light emitting diode of claim 7, wherein the scattering layer comprises a surface roughness that prevents the occurrence of Newton's rings within the organic light emitting diode display.

11. The organic light emitting diode display of claim 7, wherein the crystallized top surface is roughened by crystallization of the material.

* * * * *